(12) United States Patent
Yu et al.

(10) Patent No.: US 11,024,827 B2
(45) Date of Patent: Jun. 1, 2021

(54) ORGANIC ELECTRONIC DEVICE

(71) Applicant: LG CHEM, LTD., Seoul (KR)

(72) Inventors: Mi Lim Yu, Daejeon (KR); Joon Hyung Kim, Daejeon (KR); Yu Jin Woo, Daejeon (KR); Kook Hyun Choi, Daejeon (KR)

(73) Assignee: LG CHEM, LTD., Seoul (KR)

( * ) Notice: Subject to any disclaimer, the term of this patent is extended or adjusted under 35 U.S.C. 154(b) by 0 days.

(21) Appl. No.: 16/616,268

(22) PCT Filed: May 24, 2018

(86) PCT No.: PCT/KR2018/005885
§ 371 (c)(1),
(2) Date: Nov. 22, 2019

(87) PCT Pub. No.: WO2018/217026
PCT Pub. Date: Nov. 29, 2018

(65) Prior Publication Data
US 2020/0091457 A1    Mar. 19, 2020

(30) Foreign Application Priority Data

May 24, 2017    (KR) .................... 10-2017-0064167

(51) Int. Cl.
*H01L 51/52*    (2006.01)

(52) U.S. Cl.
CPC .. *H01L 51/5246* (2013.01); *H01L 2251/5338* (2013.01)

(58) Field of Classification Search
CPC ......... H01L 51/5253; H01L 2251/5338; H01L 51/0097; H01L 51/5246; H01L 51/004; H01L 51/0043
See application file for complete search history.

(56) References Cited

U.S. PATENT DOCUMENTS

| | | | |
|---|---|---|---|
| 5,936,934 A * | 8/1999 | Kuribayashi | G11B 7/256 369/286 |
| 7,369,581 B2 | 5/2008 | Yamanaka et al. | |
| 9,786,843 B2 | 10/2017 | Chung et al. | |
| 9,957,426 B2 | 5/2018 | Cho et al. | |
| 10,181,577 B1 | 1/2019 | Choi et al. | |

(Continued)

FOREIGN PATENT DOCUMENTS

| | | |
|---|---|---|
| JP | 2000111857 | 4/2000 |
| JP | 2006307154 | 11/2006 |

(Continued)

OTHER PUBLICATIONS

International Search Report and the Written Opinion of PCT/KR2018/005885, dated Aug. 23, 2018.

(Continued)

*Primary Examiner* — Jaehwan Oh
(74) *Attorney, Agent, or Firm* — Dentons US LLP

(57) ABSTRACT

Provided is an organic electronic device and a method for manufacturing the same. The organic electronic device can effectively block moisture or oxygen from being introduced from the outside into the organic electronic device. The organic electronic device can secure the lifetime of an organic electronic element and has excellent durability while being applicable to a flexible device.

18 Claims, 1 Drawing Sheet

(56) References Cited

U.S. PATENT DOCUMENTS

| | | | |
|---|---|---|---|
| 10,442,960 B2 | 10/2019 | Bae et al. | |
| 2008/0107821 A1 | 5/2008 | Sasa et al. | |
| 2014/0217621 A1* | 8/2014 | Yoo | B32B 3/04 |
| | | | 257/788 |
| 2018/0171179 A1* | 6/2018 | Bae | C09J 4/00 |
| 2018/0171188 A1* | 6/2018 | Bae | H01L 51/004 |

FOREIGN PATENT DOCUMENTS

| | | |
|---|---|---|
| JP | 5219872 | 6/2013 |
| JP | 2014019800 | 2/2014 |
| JP | 2014148580 | 8/2014 |
| JP | 2014-225380 | 12/2014 |
| JP | 2015504579 | 2/2015 |
| KR | 20050033031 | 4/2005 |
| KR | 10-2009-0107874 | 10/2009 |
| KR | 10-2015-0141399 | 12/2015 |
| KR | 20160048795 | 5/2016 |
| KR | 20160065778 | 6/2016 |
| KR | 10-2016-0144932 | 12/2016 |
| KR | 10-2017-0003169 | 1/2017 |
| WO | 2016200180 | 12/2016 |

OTHER PUBLICATIONS

Office Action of Taiwanese Office in Appl'n No. 107117770, dated Apr. 30, 2019.
Office Action of Japanese Patent Office in Appl'n No. 2019-565009, dated Dec. 7, 2020.

* cited by examiner

[Figure 1]
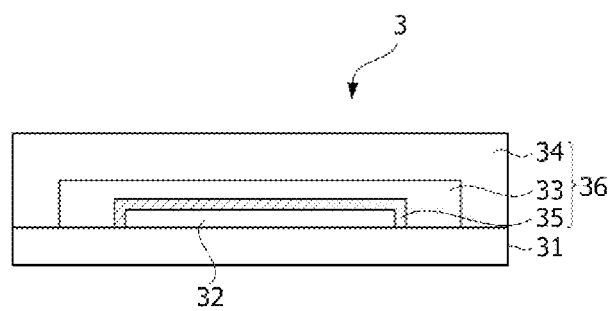
[Figure 2]
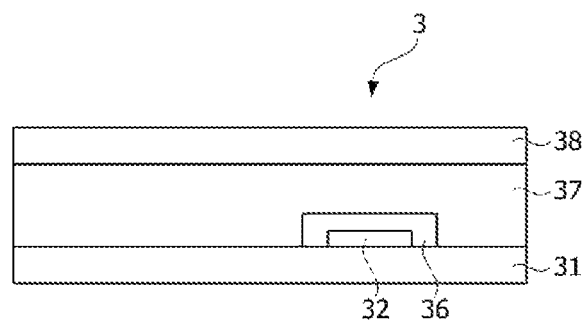

ORGANIC ELECTRONIC DEVICE

This application is a National Stage Application of International Application No. PCT/KR2018/005885 filed on May 24, 2018, which claims the benefit of priority based on Korean Patent Application No. 10-2017-0064167 filed on May 24, 2017, the disclosures of which are incorporated herein by reference in their entirety.

TECHNICAL FIELD

The present application relates to an organic electronic device and a method for manufacturing the same.

BACKGROUND ART

An organic electronic device (OED) means a device comprising a layer of an organic material that generates an alternating current of electric charges using holes and electrons, and an example thereof can include a photovoltaic device, a rectifier, a transmitter and an organic light emitting diode (OLED), and the like.

The organic light emitting diode (OLED) among the organic electronic devices has lower power consumption and faster response speed, than conventional light sources, and is advantageous for thinning display devices or illuminations. In addition, the OLED has excellent space utilization, so that it is expected to be applied in various fields covering various portable devices, monitors, notebooks, and televisions.

In commercialization and application expansion of OLEDs, the most important problem is a durability problem. Organic materials and metal electrodes, and the like, contained in OLEDs are very easily oxidized by external factors such as moisture. Thus, products comprising OLEDs are highly sensitive to environmental factors. Accordingly, various methods have been proposed to effectively block penetration of oxygen or moisture from the outside into organic electronic devices such as OLEDs.

DISCLOSURE

Technical Problem

The present application provides an organic electronic device which can effectively block moisture or oxygen introduced from the outside into the organic electronic device to secure the lifetime of an organic electronic element and has excellent durability while being applicable to a flexible device.

Technical Solution

The present application relates to an organic electronic device. As shown in FIG. 1, an exemplary organic electronic device (3) can comprise a substrate (31); an organic electronic element (32) formed on the substrate (31); and an organic layer (33) that seals the organic electronic element (32). The organic layer can be formed by sealing or encapsulating the entire surface of an organic electronic element such as, for example, an OLED with an encapsulating composition. In one example, the encapsulating composition of the present application can be an ink composition. In addition, the organic layer (33) can be laminated on an organic electronic element together with an inorganic protective layer (35) and/or an inorganic layer (34) to form a sealing structure (36). In the present application, the organic layer can be an ink composition, which can be distinguished from a pressure-sensitive adhesive film or an adhesive film as a sealing film (37) that is laminated on the organic electronic element (32), as shown in FIG. 2. Accordingly, the organic electronic device of the present application can further comprise a pressure-sensitive adhesive film or an adhesive film (37) on the sealing structure (36).

In an embodiment of the present application, the present application relates to an organic electronic device to which an encapsulating composition for sealing an organic electronic element applicable to an inkjet process is applied, where the composition can be designed to have appropriate physical properties, when it has been discharged onto a substrate by using inkjet printing capable of non-contact type patterning.

In this specification, the term "organic electronic device" means an article or device having a structure comprising an organic material layer that generates an alternating current of electric charges using holes and electrons between a pair of electrodes facing each other, and an example thereof can include a photovoltaic device, a rectifier, a transmitter and an organic light emitting diode (OLED), and the like, but is not limited thereto. In one example of the present application, the organic electronic device can be an OLED.

In an embodiment of the present application, the organic electronic device can comprise one or more foldable parts satisfying Equation 1 below.

$$X \leq 10\% \quad [\text{Equation 1}]$$

In Equation 1, X is a luminance change rate before and after a folding test in which a process of folding the foldable part of the organic electronic device at a temperature of 25° C. and 50% relative humidity so that a curvature radius is 2.5R (2.5 mm) is repeated 100,000 times. More specifically, in the present application, the luminance change rate can be 10% or less, 9.5% or less, 8.5% or less, or 7.5% or less, and the lower limit is not particularly limited, and can be 0% or more, or 0.01% or more. An organic electronic device of the present application can have one or more foldable parts, considering that the organic electronic device is applied to a flexible display. The foldable part can mean an area which can be folded in the organic electronic device.

In the conventional flexible display, the organic layer formed on the organic electronic element was difficult to have both flexibility and surface hardness of the organic layer. There was a problem in that when it was applied to the flexible display because of high flexibility, the hardness was lowered and when the hardness was high, the peeling occurred upon the folding test. The present application provides an organic electronic device having high reliability in a flexible display by controlling the luminance change rate in a range of Equation 1 above.

In one example, the thickness of the organic layer can be in a range of 2 μm to 20 μm, 2.5 μm to 19 μm or 3 μm to 18.5 μm. The present application can provide a thin organic electronic device in which the organic layer is provided to have a thin thickness in the above range, thereby imparting flexible characteristics.

In an embodiment of the present application, the organic layer can have pencil hardness of 3H or more, 3.5H or more, or 4H or more as measured according to ASTM D3363 standard. The hardness can be, for example, pencil hardness at a speed of 273 mm/min under a weight of 500 g, which can be a measurement result value for the organic layer having a thickness of 2 to 20 μm. Since the higher the hardness in the above range, the higher the reliability of the organic layer, the upper limit is not particularly limited, but can be 9H or less in consideration of the flexible characteristics. By adjusting the pencil hardness of the organic layer to the above range, the present application realizes high endurance reliability in spite of the thin organic layer.

As described above, the organic layer can comprise an ink composition, where the ink composition can have a viscosity of 50 cP or less, 1 to 46 cP or 5 to 44 cP as measured by DV-3 from Brookfield, Inc. at a temperature of 25° C., 90% torque and a shear rate of 100 rpm. By controlling the viscosity of the composition in the above range, the present application can realize a physical property capable of ink-jetting at the time of being applied to an organic electronic device, and can provide a sealing material of a thin layer with excellent coating property.

In one example, the organic layer can comprise an epoxy compound and a compound having an oxetane group. By comprising the specific composition, the present application can realize the above-described flexible characteristics and excellent hardness together. The epoxy compound can be a photocurable or thermosetting compound. The compound having an oxetane group can be present in an amount of 45 to 145 parts by weight, 48 to 144 parts by weight, 63 to 143 parts by weight or 68 to 142 parts by weight relative to 100 parts by weight of the epoxy compound. In this specification, the term "part by weight" can mean a weight ratio between the respective components. By controlling the specific composition and the content range thereof, an organic layer can form on an organic electronic element by an ink-jet method and provide an organic layer in which the applied encapsulating composition has excellent spreadability in a short time and has excellent hardening strength after curing. In one example, the composition of the present application can have a contact angle to glass of 30° or less, 25° or less, 20° or less, or 12° or less. The lower limit is not particularly limited, but can be 1° or 3° or more. By adjusting the contact angle to 30° or less, the present application can ensure spreadability in a short time in the inkjet coating, thereby forming an organic layer of a thin layer. In the present application, the contact angle can be measured by applying a drop of the encapsulating composition onto glass using a sessile drop measurement method, which can be an average value measured after applying 5 times.

In one example, the epoxy compound and the compound having an oxetane group can be present in an amount of 70 wt % or more, 75 wt % or more, 80 wt % or more, 85 wt % or more, or 89 wt % or more in the entire component of the encapsulating composition. The upper limit is not particularly limited, and can be 99 wt % or less, 95 wt % or less, or 93 wt % or less.

In one example, the epoxy compound can have at least monofunctionality or bifunctionality or more. That is, one or two or more of the epoxy functional groups can be present in the compound, where the upper limit is not particularly limited, but can be 10 or less. The epoxy compound exhibits excellent heat resistance durability at high temperature and high humidity by achieving an appropriate degree of cross-linking to the ink composition.

In an embodiment of the present application, the epoxy compound can comprise a compound having a cyclic structure in its molecular structure and/or a linear or branched aliphatic compound. That is, the encapsulating composition of the present application can comprise at least one of a compound having a cyclic structure in its molecular structure and a linear or branched aliphatic compound as an epoxy compound, and can comprise them together. In one example, the compound having a cyclic structure in its molecular structure can have ring constituent atoms in the molecular structure in a range of 3 to 10, 4 to 8, or 5 to 7, and one or more, or two or more, or 10 or less of the cyclic structures can be present in the compound. When the compound having a cyclic structure and the linear or branched aliphatic compound are included together, the linear or branched aliphatic compound can be included in the encapsulating composition in a range of 20 parts by weight or more, less than 205 parts by weight, or 23 parts by weight to 204 parts by weight, 30 parts by weight to 203 parts by weight, 34 parts by weight to 202 parts by weight, 40 parts by weight to 201 parts by weight, 60 parts by weight to 200 parts by weight or 100 parts by weight to 173 parts by weight, relative to 100 parts by weight of the compound having a cyclic structure. By controlling the content range, the present application makes it possible for the encapsulating composition to prevent element damage in sealing the entire surface of an organic electronic element, to have appropriate physical properties capable of ink-jetting, to have excellent curing strength after curing and also to realize excellent moisture barrier properties together.

In one example, the epoxy compound can have an epoxy equivalent in a range of 50 to 350 g/eq, 73 to 332 g/eq, 94 to 318 g/eq, or 123 to 298 g/eq. Also, the compound having an oxetane group or the epoxy compound can have a weight average molecular weight in a range of 150 to 1,000 g/mol, 173 to 980 g/mol, 188 to 860 g/mol, 210 to 823 g/mol or 330 to 780 g/mol. By controlling the epoxy equivalent of the epoxy compound to be low or controlling the weight average molecular weight of the compound to be low, the present application can prevent the viscosity of the composition from becoming too high to make the inkjet process impossible, while improving the degree of curing completion after curing of the encapsulating composition and simultaneously provide moisture barrier property and excellent curing sensitivity. In this specification, the weight average molecular weight means a value converted to standard polystyrene measured by GPC (gel permeation chromatograph). In one example, a column made of a metal tube having a length of 250 to 300 mm and an inner diameter of 4.5 to 7.5 mm is filled with 3 to 20 mm polystyrene beads. When a solution diluted by dissolving a substance to be measured in a THF solvent is passed through the column, the weight average molecular weight can be indirectly measured according to a flowing time. It can be detected by plotting amounts separated from the column by size for each time. In this specification, the epoxy equivalent is also grams (g/eq) of the resin comprising one gram equivalent of an epoxy group, which can be measured according to the method defined in JIS K 7236.

The compound having an oxetane group can have a boiling point in a range of 90 to 300° C., 98 to 270° C., 110 to 258° C., or 138 to 237° C. By controlling the boiling point of the compound to the above range, the present application can provide a sealing material which can have excellent moisture barrier properties from the outside while realizing excellent printability even at a high temperature in an inkjet process, and prevent damage applied to the element due to suppressed outgas. In this specification, the boiling point can be measured at 1 atm, unless otherwise specified.

In one example, the compound having a cyclic structure in its molecular structure can be exemplified by 3,4-epoxy-cyclohexylmethyl 3',4'-epoxycyclohexanecarboxylate (EEC) and derivatives, dicyclopentadiene dioxide and derivatives, vinylcyclohexene dioxide and derivatives, or 1,4-cyclohexanedimethanol bis(3,4-epoxycyclohexanecarboxylate) and derivatives, but is not limited thereto.

In one example, as long as the compound comprising an oxetane group has the functional group, the structure is not limited, and for example, OXT-221, CHOX, OX-SC, OXT101, OXT121, OXT221 or OXT212 from TOAGOSEI, or EHO, OXBP, OXTP or OXMA from ETERNACOLL can be exemplified. Also, the linear or branched aliphatic epoxy compound can include aliphatic glycidyl ether, 1,4-butanediol diglycidyl ether, ethylene glycol diglycidyl ether, 1,6-hexanediol diglycidyl ether, propylene glycol diglycidyl ether, diethylene glycol diglycidyl ether, butyl glycidyl ether, 2-ethylhexyl glycidyl ether or neopentyl glycol diglycidyl ether, but is not limited thereto.

In an embodiment of the present application, the encapsulating composition can further comprise a photoinitiator. The photoinitiator can be an ionic photoinitiator. In addition, the photoinitiator can be a compound that absorbs a wavelength in a range of 200 nm to 400 nm. By using the photoinitiator, the present application can achieve excellent curing properties in the specific composition of the present application.

In one example, the photoinitiator can be a cationic photopolymerization initiator. As the cationic photopolymerization initiator, a known material in the art can be used and for example, it can include a compound having a cation moiety comprising aromatic sulfonium, aromatic iodonium, aromatic diazonium or aromatic ammonium and an anion moiety comprising $AsF_6^-$, $SbF_6^-$, $PF_6^-$, or tetrakis(pentafluorophenyl) borate. Furthermore, as the cationic photopolymerization initiator, an ionized cationic initiator of onium salt or organometallic salt series or a non-ionized cationic photopolymerization initiator of organic silane or latent sulfonic acid series can be exemplified. A diaryliodonium salt, a triarylsulfonium salt or an aryldiazonium salt and the like can be exemplified as the initiator of the onium salt series, iron arene or the like can be exemplified as the initiator of the organometallic salt series, o-nitrobenzyl triaryl silyl ether, triaryl silyl peroxide or an acyl silane and the like can be exemplified as the initiator of the organosilane series, and α-sulfonyloxy ketone or α-hydroxymethylbenzoin sulfonate and the like can be exemplified as the initiator of the latent sulfuric acid series, without being limited thereto.

In one example, the encapsulating composition of the present application can comprise a photoinitiator comprising a sulfonium salt as a photoinitiator in the above-mentioned specific composition, so as to be suitable for use in sealing an organic electronic element by an inkjet method. Although the encapsulating composition according to the above composition is directly sealed on the organic electronic element, it is possible to prevent chemical damage from being applied to the element due to a small amount of generated outgas. Furthermore, the photoinitiator comprising a sulfonium salt also has excellent solubility, which can be suitably applied to an inkjet process.

In an embodiment of the present invention, the photoinitiator can be included in an amount of 1 to 15 parts by weight, 3 to 14 parts by weight, or 7 to 13.5 parts by weight relative to 100 parts by weight of the epoxy compound. The present application can minimize the physical and chemical damage to the organic electronic element due to the nature of the encapsulating composition of the present application applied directly onto the element by controlling the photoinitiator content range.

In an embodiment of the present application, the organic layer can further comprise a surfactant. The encapsulating composition can be provided as a liquid ink having improved spreadability by comprising a surfactant. In one example, the surfactant can comprise a polar functional group, and the polar functional group can be present at the compound structural end of the surfactant. The polar functional group can include, for example, a carboxyl group, a hydroxyl group, a phosphate, an ammonium salt, a carboxylate group, a sulfate or a sulfonate. Furthermore, in an embodiment of the present application, the surfactant can be a non-silicone-based surfactant or a fluorine-based surfactant. The non-silicone-based surfactant or the fluorine-based surfactant can be applied together with the above-described epoxy compound and compound having an oxetane group to provide excellent coating properties on the organic electronic element. On the other hand, in the case of a surfactant comprising a polar reactive group, it can have high affinity with the other components of the encapsulating composition, thereby realizing an excellent effect in terms of adhesion. In an embodiment of the present application, a hydrophilic fluorine-based surfactant or non-silicone-based surfactant can be used to improve coating properties of a base material.

Specifically, the surfactant can be a polymer type or oligomer type fluorine-based surfactant. As the surfactant, a commercially available product can be used, which can be selected from the group consisting of Glide 100, Glide 110, Glide 130, Glide 460, Glide 440, Glide 450 or RAD 2500 from TEGO, Megaface F-251, F-281, F-552, F554, F-560, F-561, F-562, F-563, F-565, F-568, F-570 and F-571 from DIC (DaiNippon Ink Chemicals), or Surflon S-111, S-112, S-113, S-121, S-131, S-132, S-141 and S-145 from Asahi Glass Co., Fluorad FC-93, FC-95, FC-98, FC-129, FC-135, FC-170C, FC-430 and FC-4430 from Sumitomo 3M Ltd., or Zonyl FS-300, FSN, FSN-100 and FSO from DuPont and BYK-350, BYK-354, BYK-355, BYK-356, BYK-358N, BYK-359, BYK-361N, BYK-381, BYK-388, BYK-392, BYK-394, BYK-399, BYK-3440, BYK-3441, BYKETOL-AQ, BYK-DYNWET 800 from BYK, and the like.

The surfactant can be included in an amount of 0.1 to 10 parts by weight, 0.05 to 10 parts by weight, 0.1 to 10 parts by weight, 0.5 to 8 parts by weight or 1 to 4 parts by weight relative to 100 parts by weight of the epoxy compound. Within the above content range, the present application allows the composition to be applied to an ink-jet method, thereby forming a thin organic layer.

In an embodiment of the present application, the encapsulating composition can comprise a photosensitizer in order to complement the curing property at a long wavelength activation energy beam of 300 nm or more. The photosensitizer can be a compound that absorbs a wavelength in a range of 200 nm to 400 nm, 250 nm to 400 nm, 300 nm to 400 nm or 350 nm to 395 nm.

The photosensitizer can be one or more selected from the group consisting of an anthracene-based compound such as anthracene, 9,10-dibutoxyanthracene, 9,10-dimethoxyanthracene, 9,10-diethoxyanthracene and 2-ethyl-9,10-dimethoxyanthracene; a benzophenone-based compound such as benzophenone, 4,4-bis(dimethylamino)benzophenone, 4,4-bis(diethylamino)benzophenone, 2,4,6-trimethylaminobenzophenone, methyl-o-benzolybenzoate, 3,3-dimethyl-4-methoxybenzophenone and 3,3,4,4-tetra(t-butylperoxycarbonyl)benzophenone; a ketone-based compound such as acetophenone, dimethoxyacetophenone, diethoxyacetophenone, 2-hydroxy-2-methyl-1-phenylpropan-1-one and propanone; perylene; a fluorene-based compound such as 9-fluorenone, 2-chloro-9-proprenone and 2-methyl-9-fluorenone; a thioxanthone-based compound such as thioxanthone, 2,4-diethylthioxanthone, 2-chlorothioxanthone, 1-chloro-4-propyloxythioxanthone, isopropylthioxanthone (ITX) and diisopropylthioxanthone; a xanthone-based compound such as xanthone and 2-methylxanthone; an anthraquinone-based compound such as anthraquinone, 2-methylanthraquinone, 2-ethyl anthraquinone, t-butylanthraquinone and 2,6-dichloro-9,10-anthraquinone; an acridine-based compound such as 9-phenylacridine, 1,7-bis(9-acridinyl)heptane, 1,5-bis(9-acridinylpentane) and 1,3-bis(9-acridinyl)propane; a dicarbonyl compound such as benzyl, 1,7,7-trimethyl-bicyclo[2,2,1]heptane-2,3-dione and 9,10-phenanthrenequinone; a phosphine oxide-based compound such as 2,4,6-trimethylbenzoyldiphenylphosphine oxide and bis(2,6-dimethoxybenzoyl)-2,4,4-trimethylpentylphosphine oxide; a benzoate-based compound such as methyl-4-(dimethylamino) benzoate, ethyl-4-(dimethylamino) benzoate and 2-n-butoxyethyl-4-(dimethylamino) benzoate; an amino synergist such as 2,5-bis(4-diethylaminobenzal)cyclopentanone, 2,6-bis(4-diethylaminobenzal)cyclohexanone and 2,6-bis(4-diethylaminobenzal)-4-methyl-cyclopentanone; a coumarin-based compound such as 3,3-carbonylvinyl-7-(diethylamino)coumarin, 3-(2-benzothiazolyl)-7-(diethylamino)coumarin, 3-benzoyl-7-(diethylamino) coumarin, 3-benzoyl-7-methoxy-coumarin and 10,10-carbonylbis[1,1,7,7-tetramethyl-2,3,6,7-tetrahydro-1H,5H, 11H-Cl]-[6,7,8-ij]-quinolizin-11-one; a chalcone compound such as 4-diethylaminochalcone and 4-azidobenzalacetophenone; 2-benzoylmethylene; and 3-methyl-b-naphthothiazoline.

The photosensitizer can be present in an amount of 28 to 40 parts by weight, 31 to 38 parts by weight or 32 to 36 parts by weight relative to 100 parts by weight of the photoinitiator. By controlling the content of the photosensitizer, the present application can prevent the photosensitizer from not dissolving to lower adhesiveness while realizing a synergistic effect of curing sensitivity at a desired wavelength.

The organic layer of the present application can further comprise a coupling agent. The present application can improve adhesiveness of a cured product of the encapsulating composition to an adherend or moisture transmission resistance of the cured product. The coupling agent can include, for example, a titanium-based coupling agent, an aluminum-based coupling agent, or a silane coupling agent.

In an embodiment of the present application, the silane coupling agent can include, specifically, an epoxy-based silane coupling agent such as 3-glycidyloxypropyltrimethoxysilane, 3-glycidyloxypropyltriethoxysilane, 3-glycidyloxypropyl (dimethoxy)methyl silane and 2-(3,4-epoxycyclohexyl)ethyltrimethoxysilane; a mercapto-based silane coupling agent such as 3-mercaptopropyltrimethoxysilane, 3-mercaptopropyltriethoxysilane, 3-mercaptopropylmethyldimethoxysilane and 11-mercaptoundecyltrimethoxysilane; an amino-based silane coupling agent such as 3-aminopropyltrimethoxysilane, 3-aminopropyltriethoxysilane, 3-aminopropyldimethoxymethyl silane, N-phenyl-3-aminopropyltrimethoxysilane, N-methylaminopropyltrimethoxysilane, N-(2-aminoethyl)-3-aminopropyltrimethoxysilane and N-(2-aminoethyl)-3-aminopropyldimethoxymethylsilane; a ureide-based silane coupling agent such as 3-ureidepropyltriethoxysilane; a vinyl-based silane coupling agent such as vinyltrimethoxysilane, vinyltriethoxysilane and vinylmethyldiethoxysilane; a styryl-based silane coupling agent such as p-styryltrimethoxysilane; an acrylate-based silane coupling agent such as 3-acryloxypropyltrimethoxysilane and 3-methacryloxypropyltrimethoxysilane; an isocyanate-based silane coupling agent such as 3-isocyanatopropyltrimethoxysilane; a sulfide-based silane coupling agent such as bis(triethoxysilylpropyl)disulfide and bis(triethoxysilylpropyl)tetrasulfide; phenyltrimethoxysilane, methacryloxypropyltrimethoxysilane, imidazolesilane, triazinesilane, and the like.

In the present application, the coupling agent can be included in an amount of 0.1 to 10 parts by weight or 0.5 to 5 parts by weight, relative to 100 parts by weight of the epoxy compound. Within the above range, an organic electronic device of the present application can realize an effect of improving the adhesiveness by the addition of the coupling agent.

The organic layer of the present application can comprise, if necessary, a moisture adsorbent. The term "moisture adsorbent" can be used to generically mean a component capable of adsorbing or removing moisture or humidity introduced from the outside through a physical or chemical reaction or the like. That is, it means a moisture-reactive adsorbent or a physical adsorbent, and a mixture thereof is also usable.

A specific kind of the usable moisture adsorbent in the present application is not particularly limited, which can include, for example, one or a mixture of two or more of a metal oxide, a metal salt or phosphorus pentoxide ($P_2O_5$), and the like, in the case of a moisture-reactive adsorbent, and can include zeolite, zirconia or montmorillonite, and the like, in the case of the physical adsorbent.

The encapsulating composition of the present application can comprise the moisture adsorbent in an amount of 5 parts by weight to 100 parts by weight, 5 to 80 parts by weight, 5 parts by weight to 70 parts by weight or 10 to 30 parts by weight, relative to 100 parts by weight of the epoxy compound. As the encapsulating composition of the present application preferably controls the content of the moisture adsorbent to 5 parts by weight or more, the encapsulating composition or the cured product thereof can exhibit excellent moisture and humidity barrier properties. In addition, by controlling the content of the moisture adsorbent to 100 parts by weight or less, the present application can provide a thin sealing structure.

In one example, the encapsulating composition can further comprise an inorganic filler, if necessary. The specific type of the usable filler in the present application is not particularly limited, and for example, one or a mixture of two or more of clay, talc, alumina, calcium carbonate, silica, and the like can be used.

The organic layer of the present application can comprise 0 to 50 parts by weight, 1 to 40 parts by weight, 1 to 20 parts by weight, or 1 to 10 parts by weight of inorganic filler, relative to 100 parts by weight of the epoxy compound. The present application can provide a sealing structure having excellent moisture or humidity barrier properties and mechanical properties by controlling the inorganic filler, preferably, to 1 part by weight or more. Furthermore, by controlling the content of the inorganic filler to 50 parts by weight or less, the present invention can provide a cured product exhibiting excellent moisture barrier properties even when formed into a thin layer.

In addition to the above-mentioned constitutions, the organic layer according to the present application can comprise various additives in the range without affecting the above-described effects of invention. For example, the encapsulating composition can comprise a defoamer, a tackifier, an ultraviolet stabilizer or an antioxidant and the like in an appropriate range of content depending on the desired physical properties.

In one example, the encapsulating composition can be in a liquid phase at room temperature, for example, at 25° C. In an embodiment of the present application, the encapsulating composition can be in a solventless type liquid phase. The encapsulating composition can be applied to sealing an organic electronic element, and specifically, can be applied to sealing the entire surface of the organic electronic element. The encapsulating composition of the present application can have a specific composition and physical properties so as to be capable of ink-jetting.

Also, the encapsulating composition of the present application can be an ink composition, as described above. The encapsulating composition of the present application can be an ink composition capable of an inkjet process. The encapsulating composition of the present application can have a specific composition and physical properties so that ink-jetting can be performed.

In one example, the encapsulating composition can have surface energy of the cured product after curing in a range of 5 mN/m to 45 mN/m, 10 mN/m to 40 mN/m, 15 mN/m to 35 mN/m, or 20 mN/m to 30 mN/m. The surface energy can be measured by a method known in the art, and for example, can be measured by a ring method. The present application can realize excellent coating properties in the above surface energy range.

In an embodiment of the present application, the surface energy ($\gamma^{surface}$, mN/m) can be calculated as $\gamma^{surface} = \gamma^{dispersion} + \gamma^{polar}$. In one example, the surface energy can be measured using a drop shape analyzer (DSA100 product from KRUSS). For example, after an encapsulating composition for measuring the surface energy is applied on a SiNx substrate to a thickness of about 50 μm and a coating area of 4 cm² (width: 2 cm, height: 2 cm) to form a sealing layer (spincoater), it is dried at room temperature for about 10 minutes under a nitrogen atmosphere and then UV-cured with an intensity of 1000 mW/cm² through a light quantity of 4000 mJ/cm². The process of dropping the deionized water whose surface tension is known on the layer after curing, and obtaining the contact angle thereof is repeated five times to obtain an average value of the obtained five contact angle values, and identically, the process of dropping the diiodomethane whose surface tension is known thereon and obtaining the contact angle thereof is repeated five times to obtain an average value of the obtained five contact angle values. Then, the surface energy can be obtained by substituting the value (Strom value) regarding the solvent surface tension by the Owens-Wendt-Rabel-Kaelble method using the obtained average values of the contact angles for the deionized water and diiodomethane.

Also, in an embodiment of the present application, the encapsulating composition can have light transmittance of 90% or more, 92% or more, or 95% or more in the visible light region after curing. Within the above range, the present application provides an organic electronic device having high-resolution, low power consumption and long-life by applying the encapsulating composition to a top emission type organic electronic device. Furthermore, the encapsulating composition of the present application can have a haze of 3% or less, 2% or less or 1% or less according to JIS K7105 standard test after curing, and the lower limit is not particularly limited, but can be 0%. Within the haze range, the encapsulating composition can have excellent optical properties after curing. In this specification, the above-mentioned light transmittance or haze can be measured in a state where the encapsulating composition is cured to an organic layer, and can be optical characteristics measured when the thickness of the organic layer is any one thickness of 2 μm to 50 μm. In an embodiment of the present application, in order to realize the optical characteristics, the above-mentioned moisture adsorbent or inorganic filler may not be included.

In one example, the encapsulating composition of the present application can have an amount of the volatile organic compound measured after curing of less than 50 ppm. In this specification, the volatile organic compound can be expressed as outgas. The volatile organic compounds can be measured after curing the encapsulating composition and then holding a sample of the cured product at 110° C. for 30 minutes using Purge & Trap-gas chromatography/mass spectrometry. The measurement can be performed using a Purge & Trap sampler (JAI JTD-505 III)-GC/MS (Agilent 7890b/5977a) instrument.

In an embodiment of the present application, the organic electronic element can comprise a first electrode layer, an organic layer formed on the first electrode layer and comprising at least a light emitting layer, and a second electrode layer formed on the organic layer. The first electrode layer can be a transparent electrode layer or a reflective electrode layer, and the second electrode layer can also be a transparent electrode layer or a reflective electrode layer. More specifically, the organic electronic element can comprise a reflective electrode layer formed on a substrate, an organic layer formed on the reflective electrode layer and comprising at least a light emitting layer, and a transparent electrode layer formed on the organic layer.

In the present application, the organic electronic element can be an organic light emitting diode.

In one example, the organic electronic device according to the present application can be a top emission type, but is not limited thereto, and can be applied to a bottom emission type.

As shown in FIG. 1, the organic electronic device can further comprise a protective layer (35) for protecting the electrodes and the light emitting layer of the element. The protective layer (35) can be an inorganic protective film. The protective layer can be a protective layer by chemical vapor deposition (CVD), where a known inorganic material can be used as the material, and for example, silicon nitride (SiNx) can be used. In one example, silicon nitride (SiNx) used as the protective layer can be deposited to a thickness of 0.01 μm to 50 μm.

As shown in FIG. 1, in an embodiment of the present application, the organic electronic device (3) can further comprise an inorganic layer (34) formed on the organic layer (33). The material of the inorganic layer (34) is not limited, and can be the same as or different from the above-described inorganic protective layer (33). In addition, the inorganic layer (34) can be formed in the same method as the inorganic protective layer (35). In one example, the inorganic layer can be one or more metal oxides or nitrides selected from the group consisting of Al, Zr, Ti, Hf, Ta, In, Sn, Zn and Si. The inorganic layer can have a thickness of 0.01 μm to 50 μm, 0.1 μm to 20 μm, or 1 μm to 10 μm. In one example, the inorganic layer of the present application can be an inorganic material without any dopant, or can be an inorganic material comprising a dopant. The dopant which can be doped can be one or more elements selected from the group consisting of Ga, Si, Ge, Al, Sn, Ge, B, In, Tl, Sc, V, Cr, Mn, Fe, Co and Ni, or an oxide of the element, but is not limited thereto.

The organic electronic device (3) of the present application can comprise a sealing structure (36) comprising the organic layer (33) and the inorganic layer (34), as described above, where the sealing structure can comprise at least one or more organic layers and at least one or more inorganic layers, and the organic layer and the inorganic layer can be repeatedly laminated. For example, the organic electronic device can have a structure of substrate/organic electronic element/inorganic protective layer/(organic layer/inorganic layer)n, where n can be a number in a range of 1 to 100. FIG. 1 is a cross-sectional view exemplarily showing a case where n is 1.

In one example, the organic electronic device (3) of the present application can further comprise a cover substrate (38) present on the organic layer (33), as shown in FIG. 2. In the present application, the material of the substrate (31) and/or the cover substrate (38) is not particularly limited, and a known material in the art can be used. For example, the substrate (31) or the cover substrate (38) can comprise a metal base material or a polymer film. As the polymer film, for example, a polyethylene terephthalate film, a polytetrafluoroethylene film, a polyethylene film, a polypropylene film, a polybutene film, a polybutadiene film, a vinyl chloride copolymer film, a polyurethane film, an ethylene-vinyl acetate film, an ethylene-propylene copolymer film, an ethylene-ethyl acrylate copolymer film, an ethylene-methyl acrylate copolymer film or a polyimide film and the like can be used. Considering that the thickness range of the substrate is applied to a flexible organic electronic device, it can be in a range of 1 to 100 μm, 10 μm to 85 or 15 μm to 70 Furthermore, the thickness of the cover substrate can be in a range of 1 to 100 μm, 10 μm to 85 or 15 μm to 70 μm.

Also, as shown in FIG. 2, the organic electronic device (3) can further comprise a sealing film (37) existing between the cover substrate (38) and the substrate (31) on which the organic electronic element (32) is formed. The sealing film (37) can be applied as a use for attaching the substrate (31) on which the organic electronic element (32) is formed and the cover substrate (38), which can be, for example, a pressure-sensitive adhesive film or an adhesive film, but is not limited thereto. The sealing film (37) can seal the entire surface of the sealing structure (36) of the above-described organic layer and inorganic layer, laminated on the organic electronic element (32).

The present application also relates to a method for manufacturing the above-described organic electronic device.

In one example, the manufacturing method can comprise a step of forming an organic layer (33) on a substrate (31) on which an organic electronic element (32) is formed on its upper part, so that the above-described encapsulating composition seals the entire surface of the organic electronic element (32).

Here, the organic electronic element (32) can be produced by forming a reflective electrode or a transparent electrode on a substrate (31) such as a metal base material or a polymer film, as a substrate (31), by a method such as vacuum deposition or sputtering, and forming an organic material layer on the reflective electrode. The organic material layer can comprise a hole injecting layer, a hole transporting layer, a light emitting layer, an electron injecting layer, and/or an electron transporting layer. Subsequently, a second electrode is further formed on the organic material layer. The second electrode can be a transparent electrode or a reflective electrode.

The manufacturing method of the present application can further comprise a step of forming an inorganic protective layer (35) on the first electrode, the organic material layer and the second electrode, formed on the substrate (31). Then, the above-described organic layer (33) is applied to cover the entire surface of the organic electronic element (32) on the substrate (31). Here, the step of forming the organic layer (33) is not particularly limited and the above-described composition can be applied to the top side of the substrate (31) using a process such as inkjet printing, gravure coating, spin coating, screen printing or reverse offset coating.

The manufacturing method can further comprise a step of irradiating the organic layer with light. In the present invention, a curing process can also be performed on an organic layer sealing an organic electronic device, and such a curing process can be performed, for example, in a heating chamber or a UV chamber, and preferably, can be performed in a UV chamber.

In one example, after the above-described encapsulating composition is applied to form an organic layer, the composition can be irradiated with light to induce cross-linking. The irradiation of light can comprise irradiating with light having a wavelength range of 250 nm to 450 nm or 300 nm to 450 nm region bands at a light quantity of 0.3 to 6 J/cm$^2$ or a light quantity of 0.5 to 5 J/cm$^2$.

In addition, the manufacturing method of the present application can further comprise a step of forming an inorganic layer (34) on the organic layer (33). As the step of forming an inorganic layer, a known method in the art can be used, which can be the same as or different from the above-described method of forming an inorganic protective layer.

Advantageous Effects

The present application provides an organic electronic device which can effectively block moisture or oxygen introduced from the outside into the organic electronic device to secure the lifetime of an organic electronic element and has excellent durability while being applicable to a flexible device.

BRIEF DESCRIPTION OF DRAWINGS

FIGS. 1 and 2 are cross-sectional views showing an organic electronic device according to one example of the present invention.

EXPLANATION OF REFERENCE NUMERALS

3: organic electronic device
31: substrate
32: organic electronic element
33: organic layer
34: inorganic layer
35: protective layer
36: sealing structure
37: sealing film
38: cover substrate

BEST MODE

Hereinafter, the present invention will be described in more detail through Examples according to the present invention and Comparative Examples not complying with the present invention, but the scope of the present invention is not limited by the following examples.

Example 1

An alicyclic epoxy compound (Celloxide 2021P, Daicel Corp.) and an aliphatic epoxy compound (DE203, HAJIN CHEM TECH) as epoxy compounds, an oxetane group-containing compound (OXT-101 from TOAGOSEI), a photoinitiator (Irgacure PAG 290 from BASF, hereinafter, I290) and a fluorine-based surfactant (F552 from DIC) were introduced into a mixing vessel in a weight ratio of 23.8: 28.7:37.5:5.0:1.0 (Celloxide2021P:DE203:OXT-101:I290: F552), respectively, at room temperature.

In the mixing vessel, a uniform encapsulating composition ink was prepared using a planetary mixer (Kurabo, KK-250s).

Apart from the above, a reflective electrode was formed on a polyimide substrate by a vacuum deposition method, and an organic material layer was formed on the reflective electrode. The organic material layer comprised a hole injecting layer, a hole transporting layer, a light emitting layer, an electron injecting layer and an electron transporting layer. Then, a transparent electrode was further formed on the organic material layer. Thereafter, an organic layer was formed on the substrate so as to seal the entire surface of the organic electronic element, thereby manufacturing an organic electronic device. The organic layer was formed by ink-jetting the ink composition as previously prepared using an inkjet printer.

Example 2

An encapsulating composition was prepared in the same manner as in Example 1, except that at room temperature, an alicyclic epoxy compound (Celloxide 2021P, Daicel Corp.) and an aliphatic epoxy compound (DE203, HAJIN CHEM TECH) as epoxy compounds, an oxetane group-containing compound (OXT-221 from TOAGOSEI), a photoinitiator (I290) and a fluorine-based surfactant (FC-4430 from 3M Company) were added to a mixing vessel in a weight ratio of 29.4:10.2:50.4:5.0:1.0 (Celloxide2021P:DE203:OXT-221:I290:FC-4430).

Example 3

An encapsulating composition and an organic electronic device were prepared in the same manner as in Example 1, except that at room temperature, an alicyclic epoxy compound (Celloxide 3000, Daicel Corp.) and an aliphatic epoxy compound (DE203, HAJIN CHEM TECH) as epoxy compounds, an oxetane group-containing compound (OXT-212 from TOAGOSEI), a photoinitiator (I290) and a fluorine-based surfactant (F552 from DIC) were added to a mixing vessel in a weight ratio of 30.0:7.2:52.8:5.0:1.0 (Celloxide 3000:DE203:OXT-212:I290:F552).

Comparative Example 1

An alicyclic epoxy compound (Celloxide 2021P, Daicel Corp.) and an aliphatic epoxy compound (DE203, HAJIN CHEM TECH) as epoxy compounds, an oxetane group-containing compound (OXT-212 from TOAGOSEI), a photoinitiator (I290) and a fluorine-based surfactant (F552 from DIC) were introduced into a mixing vessel in a weight ratio of 2.3:23.4:64.3:5.0:1.0 (Celloxide2021P:DE203:OXT-212:I290:F552).

In the mixing vessel, a uniform encapsulating composition ink was prepared using a planetary mixer (Kurabo, KK-250s).

Apart from the above, a reflective electrode was formed on a polyimide substrate by a vacuum deposition method, and an organic material layer was formed on the reflective electrode. The organic material layer comprised a hole injecting layer, a hole transporting layer, a light emitting layer, an electron injecting layer and an electron transporting layer. Then, a transparent electrode was further formed on the organic material layer. Thereafter, an organic layer was formed on the substrate so as to seal the entire surface of the organic electronic element, thereby manufacturing an organic electronic device. The organic layer was formed by ink-jetting the ink composition as previously prepared using an inkjet printer.

Comparative Example 2

An encapsulating composition and an organic electronic device were prepared in the same manner as in Comparative Example 1, except that at room temperature, an alicyclic epoxy compound (Celloxide 2081, Daicel Corp.) and an aliphatic epoxy compound (DE203, HAJIN CHEM TECH) as epoxy compounds, an oxetane group-containing compound (OXT-221 from TOAGOSEI), a photoinitiator (I290) and a silicone-based surfactant (BYK399 from BYK Co., Ltd.) were added to a mixing vessel in a weight ratio of 24.8:24.3:40.9:5.0:1.0 (Celloxide 208:DE203:OXT-221:I290:BYK1798).

Comparative Example 3

An encapsulating composition was prepared in the same manner as in Example 1, except that at room temperature, an alicyclic epoxy compound (Celloxide 2021P, Daicel Corp.) as an epoxy compound, an oxetane group-containing compound (OXT-221 from TOAGOSEI), a photoinitiator containing a sulfonium salt (I290) and a fluorine-based surfactant (F552 from DIC) were added to a mixing vessel in a weight ratio of 37.5:52.5:5.0:1.0 (Celloxide2021P:OXT-221:I290:F552).

Comparative Example 4

An encapsulating composition was prepared in the same manner as in Example 1, except that at room temperature, an alicyclic epoxy compound (Celloxide 2021P, Daicel Corp.) and an aliphatic epoxy compound (DE203, HAJIN CHEM TECH) as epoxy compounds, an oxetane group-containing compound (OXT-221 from TOAGOSEI), a photoinitiator (I290) and a fluorine-based surfactant (F552 from DIC) were added to a mixing vessel in a weight ratio of 37.5:7.0:45.5:5.0:1.0 (Celloxide2021P:DE203:OXT-221:I290:F552).

Comparative Example 5

An encapsulating composition was prepared in the same manner as in Example 1, except that at room temperature, an alicyclic epoxy compound (Celloxide 2081P, Daicel Corp.) and an aliphatic epoxy compound (DE203, HAJIN CHEM TECH) as epoxy compounds, an oxetane group-containing compound (OXT-221 from TOAGOSEI), a photoinitiator (I290) and a fluorine-based surfactant (F552 from DIC) were added to a mixing vessel in a weight ratio of 20.0:41.0:29.0:5.0:1.0 (Celloxide 2081P:DE203:OXT-221:I290:F552).

Comparative Example 6

An encapsulating composition was prepared in the same manner as in Example 1, except that Irgacure 250 (active contents 75 wt %, solvent (propylene carbonate) 25 wt %), which is an iodonium photoinitiator from BASF, was used instead of I290 as a photoinitiator.

Comparative Example 7

An encapsulating composition was prepared in the same manner as in Example 1, except that UV692 (active contents 50 wt %, solvent (propylene carbonate) 50 wt %), which is a photoinitiator containing a sulfonium salt from BASF, was used instead of I290 as a photoinitiator.

Physical properties in Examples and Comparative Examples were evaluated in the following manner.

1. Viscosity Measurement

Viscosity of the encapsulating compositions prepared in Examples and Comparative Examples was measured using DV-3 as a Brookfield viscometer as follows.

For the prepared encapsulating compositions, the viscosity was measured at a temperature of 25° C., 90% torque and a shear rate of 100 rpm. Specifically, the viscosity was measured by injecting 0.5 ml of a sample using a cone/plate method of the Brookfield viscometer.

2. Curing Sensitivity Measurement

The encapsulating compositions prepared in Examples and Comparative Examples were irradiated with UV of 1 J/cm² at an intensity of 1000 mW/cm² and then tack free time of the adhesive was measured. First, the encapsulating composition was applied by spin coating to the thickness described in Table 1 and cured. The tack free time is defined as the time until the tacky feeling disappears when the surface of the sealing material is touched immediately after curing and the sealing material does not come out at all, and was measured. It was classified as ◎ in the case where the tack free time was less than 1 second, O in the case where it was less than 1 minute, Δ in the case where it was 5 minutes or more, and X in the case where it was 30 minutes or more.

3. Surface Hardness Measurement

The encapsulating compositions prepared in Examples and Comparative Examples were each applied onto an LCD glass base material of 50 mm×50 mm through spin coating to the thickness described in Table 1. The applied composition was cured at a light quantity of 1000 mJ/cm² through an LED UV lamp. The cured product was subjected to a surface hardness test at a speed of 273 mm/min under a weight of 500 g in accordance with ASTM D3363 standard using a pencil hardness tester from H to 5H.

4. Organic Layer Thickness

When the encapsulating compositions prepared in Examples and Comparative Examples were ink-jetted, they were judged good if the organic layer was formed to a thickness of 20 μm or less, and classified as normal in the case where the organic layer was formed to a thickness of 40 μm or less and defective in the case where the organic layer was formed to a thickness of 60 μm or less. As indicated in Table 1 below, in the case of Comparative Examples 2 to 5, it was practically impossible to form a thin organic layer of 20 μm or less.

5. Measurement of Luminance Change Rate

The organic layers of the organic electronic devices manufactured in Examples and Comparative Examples were irradiated with UV of 1 J/cm² at an intensity of 1000 mW/cm² and cured.

For the produced organic electronic device, the luminance change rate was measured after a folding test in which a process of folding the foldable part of the organic electronic device at a temperature of 25° C. and 50% relative humidity so that a curvature radius was 2.5 R (2.5 mm) was repeated 100,000 times. The luminance change rate was measured using KSC 7613 national standard. The change rate was calculated as (|average luminance after folding−average luminance before folding|)/average luminance before folding−100.

TABLE 1

|  |  | Viscosity (cPs) | Curing Sensitivity | Surface Harness | Organic Layer Average Thickness | Luminance Change Rate |
|---|---|---|---|---|---|---|
| Example | 1 | 23.7 | ◎ | 5H | 18 μm | 9% reduction |
|  | 2 | 15.3 | ◎ | 5H | 14 μm | 8% reduction |
|  | 3 | 8.6 | O | 4H | 10 μm | 7% reduction |
| Comparative | 1 | 11.2 | Δ | 1H | 13 μm | 17% reduction |
| Example | 2 | 24.6 | O | 5H | 42 μm | 26% reduction |
|  | 3 | 66 | ◎ | 3H | 68 μm | 23% reduction |
|  | 4 | 70 | ◎ | 4H | 75 μm | 11% reduction |
|  | 5 | 46 | ◎ | 2H | 55 μm | 32% reduction |
|  | 6 | 22 | O | 2H | 16 μm | 42% reduction |
|  | 7 | 20 | O | 1H | 15 μm | 48% reduction |

The invention claimed is:

1. An organic electronic device, comprising:
a substrate;
an organic electronic element formed on the substrate; and
an organic layer sealing the organic electronic element,
wherein the organic electronic device comprises one or more foldable parts satisfying Equation 1 below:

$$X \leq 10\% \quad \text{Equation 1}$$

wherein X is a luminance change rate before and after a folding test in which a process of folding the one or more foldable parts of the organic electronic device at a temperature of 25° C. and 50% relative humidity so that a curvature radius is 2.5R (2.5 mm) is repeated 100,000 times, and
wherein the organic layer comprises an epoxy compound and a compound having an oxetane group in an amount of 45 parts by weight to 145 parts by weight relative to 100 parts by weight of the epoxy compound.

2. The organic electronic device according to claim 1, wherein the organic layer comprises an ink composition.

3. The organic electronic device according to claim 1, wherein the organic layer has a thickness in a range of 2 to 20 μm.

4. The organic electronic device according to claim 1, wherein the organic layer has a pencil hardness of 3H or more according to ASTM D3363 standard.

5. The organic electronic device according to claim 2, wherein the ink composition has a viscosity of 50 cP or less as measured by DV-3 from Brookfield at a temperature of 25° C., 90% torque and a shear rate of 100 rpm.

6. The organic electronic device according to claim 1, wherein the epoxy compound has at least bifunctionality.

7. The organic electronic device according to claim 1, wherein the epoxy compound comprises a compound having a cyclic structure in its molecular structure and/or a linear or branched aliphatic compound.

8. The organic electronic device according to claim 7, wherein:
the epoxy compound comprises the compound having a cyclic structure in its molecular structure and the linear or branched aliphatic compound; and
the linear or branched aliphatic compound is present in an amount of 20 parts by weight or more and less than 205 parts by weight, relative to 100 parts by weight of the compound having a cyclic structure.

9. The organic electronic device according to claim 1, wherein the compound having an oxetane group has a boiling point in a range of 90 to 300° C.

10. The organic electronic device according to claim 1, wherein the compound having an oxetane group has a weight average molecular weight in a range of 150 to 1,000 g/mol.

11. The organic electronic device according to claim 1, wherein the organic layer comprises a surfactant.

12. The organic electronic device according to claim 11, wherein the surfactant comprises a polar functional group.

13. The organic electronic device according to claim 11, wherein the surfactant comprises a fluorine-based compound.

14. The organic electronic device according to claim 1, wherein the organic layer comprises a photoinitiator.

15. The organic electronic device according to claim 14, wherein the photoinitiator comprises a sulfonium salt.

16. The organic electronic device according to claim 2, wherein the ink composition is a solventless ink composition.

17. The organic electronic device according to claim 1, further comprising an inorganic protective layer between the organic electronic element and the organic layer.

18. A method for manufacturing the organic electronic device according to claim 1, comprising forming an organic layer on a substrate on which the organic electronic element is formed, and sealing the entire surface of the organic electronic element with an encapsulating composition.

* * * * *